United States Patent
Wang et al.

(10) Patent No.: US 12,183,223 B2
(45) Date of Patent: Dec. 31, 2024

(54) FOLDING DISPLAYER SUPPORT AND DISPLAY APPARATUS

(71) Applicant: BOE Technology Group Co., Ltd., Beijing (CN)

(72) Inventors: Haoran Wang, Beijing (CN); Paoming Tsai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 168 days.

(21) Appl. No.: 17/794,327

(22) PCT Filed: Aug. 12, 2021

(86) PCT No.: PCT/CN2021/112234
§ 371 (c)(1),
(2) Date: Jul. 21, 2022

(87) PCT Pub. No.: WO2022/062750
PCT Pub. Date: Mar. 31, 2022

(65) Prior Publication Data
US 2023/0049246 A1   Feb. 16, 2023

(30) Foreign Application Priority Data

Sep. 24, 2020   (CN) .......................... 202011015356.4

(51) Int. Cl.
*G06F 1/16* (2006.01)
*G09F 9/30* (2006.01)
*H05K 1/03* (2006.01)

(52) U.S. Cl.
CPC ............ *G09F 9/301* (2013.01); *G06F 1/1652* (2013.01); *H05K 1/0393* (2013.01)

(58) Field of Classification Search
CPC G09F 9/301; H05K 1/0393; H10K 2102/311; H10K 77/111; Y02E 10/549
See application file for complete search history.

(56) References Cited

U.S. PATENT DOCUMENTS 10,664,014 B2 *   5/2020   Cui .................. G06F 1/1643
10,901,541 B2 *   1/2021   Ko .................... G06F 3/0412
(Continued)

FOREIGN PATENT DOCUMENTS

CN   107086010 A   8/2017
CN   208141720 U   11/2018
(Continued)

OTHER PUBLICATIONS

CN 202011015356.4 first office action.
PCT/CN2021/112234 international search report and written opinion.

*Primary Examiner* — Rockshana D Chowdhury
(74) *Attorney, Agent, or Firm* — IPro, PLLC

(57) ABSTRACT

A folding displayer support and a display apparatus are provided. The folding displayer support includes a support body, the support body is provided with at least one first bending region extending in a first direction, at least one second bending region extending in a second direction, and at least one bidirectional bending region located at a position where the first bending region intersects with the second bending region, and an included angle is formed between the first direction and the second direction. The first bending region is provided with a first mesh pattern, the second bending region is provided with a second mesh pattern, the bidirectional bending region is provided with a third mesh pattern, a proportion of holes of the first mesh pattern and a proportion of holes of the second mesh pattern are less than a proportion of holes of the third mesh pattern.

10 Claims, 3 Drawing Sheets

(56) References Cited

U.S. PATENT DOCUMENTS

| | | | |
|---|---|---|---|
| 11,644,864 B2* | 5/2023 | Seo | G06F 1/1652 |
| | | | 361/679.01 |
| 11,908,349 B2* | 2/2024 | Zhao | G06F 1/1652 |
| 11,914,826 B2* | 2/2024 | Ye | G06F 3/0446 |
| 11,915,625 B2* | 2/2024 | Min | G09F 9/301 |
| 2017/0285691 A1* | 10/2017 | Baek | G06F 1/1652 |
| 2018/0074553 A1* | 3/2018 | Yamazaki | H10K 77/111 |
| 2018/0304575 A1 | 10/2018 | Liu et al. | |
| 2020/0008308 A1 | 1/2020 | Shin et al. | |
| 2020/0136085 A1* | 4/2020 | Wang | H05K 1/147 |
| 2020/0194698 A1 | 6/2020 | Zhai | |
| 2020/0273379 A1 | 8/2020 | Wang et al. | |
| 2020/0275561 A1* | 8/2020 | Park | H05K 5/0226 |
| 2021/0012688 A1 | 1/2021 | Lee et al. | |
| 2021/0027666 A1* | 1/2021 | Wang | G06F 1/1652 |
| 2021/0149448 A1 | 5/2021 | Cao et al. | |
| 2021/0151697 A1* | 5/2021 | Cao | H10K 77/111 |
| 2021/0153363 A1 | 5/2021 | Cao et al. | |
| 2021/0165454 A1 | 6/2021 | Dong et al. | |
| 2022/0043480 A1* | 2/2022 | Seo | G09F 9/301 |
| 2022/0400559 A1* | 12/2022 | Jiang | G09F 9/301 |

FOREIGN PATENT DOCUMENTS

| | | |
|---|---|---|
| CN | 109523921 A | 3/2019 |
| CN | 109980124 A | 7/2019 |
| CN | 110335546 A | 10/2019 |
| CN | 110689813 A | 1/2020 |
| CN | 110767096 A | 2/2020 |
| CN | 110792905 A | 2/2020 |
| CN | 110910761 A | 3/2020 |
| CN | 110992828 A | 4/2020 |
| CN | 111312080 A | 6/2020 |
| CN | 112037662 A | 12/2020 |
| GB | 2606893 | 11/2022 |
| KR | 20200079956 A | 7/2020 |

\* cited by examiner

FOLDING DISPLAYER SUPPORT AND DISPLAY APPARATUS

CROSS-REFERENCE TO RELATED APPLICATIONS

This application is the U.S. national phase of PCT Application No. PCT/CN2021/112234 filed on Aug. 12, 2021, which claims a priority to Chinese Patent Application No. 202011015356.4 filed in China on Sep. 24, 2020, the entire contents of which are hereby incorporated by reference.

TECHNICAL FIELD

The present disclosure relates to the technical field of display, and more particularly, to a folding displayer support and a display apparatus.

BACKGROUND

With the development of flexible display technology, people pay more attention to the design of flexible displays with different bending radiuses and folding configurations. Given the relatively light and thin nature of flexible OLED displays, metal supports are critical to improve overall display supportability, tension resistance, and impact resistance. A display bendable in two directions allow the mounted devices to present different shapes and display states, and have a wide range of applications. However, since the current metal supports have one bending direction, there is no metal support for displays with two or more bending directions, which affects the development of displays with multiple bending directions.

SUMMARY

Embodiments of the present disclosure provide a folding displayer support and a display apparatus which can achieve folding in multiple bending directions.

The present disclosure provides the following technical solutions.

An embodiment of the present disclosure provides a folding displayer support, including a support body. The support body is provided with at least one first bending region extending in a first direction, at least one second bending region extending in a second direction, and at least one bidirectional bending region located at a position where the first bending region intersects with the second bending region, and an included angle is formed between the first direction and the second direction; the first bending region is provided with a first mesh pattern, the second bending region is provided with a second mesh pattern, the bidirectional bending region is provided with a third mesh pattern, a proportion of holes of the first mesh pattern and a proportion of holes of the second mesh pattern are less than a proportion of holes of the third mesh pattern, and the proportion of holes is a percentage of an area occupied by holes in a unit area; and a shape of the hole of the third mesh pattern is axisymmetric about a bending axis of the first bending region and a bending axis of the second bending region.

Illustratively, the third mesh pattern includes a first hollowed-out portion and a first solid mesh line portion, the first hollowed-out portion includes a first hole array, the first hole array includes a plurality of first holes distributed in an array, each of the first holes is a cross-shaped hole including a first strip-shaped hole and a second strip-shaped hole arranged in a cross shape, a length extension direction of the first strip-shaped hole is the first direction, and a length extension direction of the second strip-shaped hole is the second direction.

Illustratively, the first hollowed-out portion further includes a second hole array, the second hole array includes a plurality of second holes distributed in an array, and each of the second holes is surrounded by the first solid mesh line portion in the middle of four adjacent first holes distributed in the array.

Illustratively, two opposite ends of the first strip-shaped hole are in a circular arc shape or an elliptical arc shape, and/or two opposite ends of the second strip-shaped hole are in a circular arc shape or an elliptical arc shape. The first solid mesh line portion at a corner of a region where the first strip-shaped hole intersects with the second strip-shaped hole is a transition curve in a circular arc shape or an elliptical arc shape.

Illustratively, the first solid mesh line portion at the corner of the region where the first strip-shaped hole intersects with the second strip-shaped hole includes at least one quarter circular arc or quarter elliptical arc, a diameter of the quarter circular arc is greater than or equal to 0.2 mm, and a minor axis of the quarter elliptical arc is longer than or equal to 0.2 mm.

Illustratively, the first mesh pattern includes a second hollowed-out portion and a second solid mesh line portion, the second hollowed-out portion includes a third hole array, the third hole array includes a plurality of third holes distributed in an array, the third holes are strip-shaped holes, and a length extension direction of the third holes is the first direction.

Illustratively, a row direction of the third hole array is the first direction, and a column direction of the third hole array is the second direction; and each row of third holes is staggered with another row of third holes that is adjacent to the each row of third holes.

Illustratively, the second mesh pattern includes: a third hollowed-out portion and a third solid mesh line portion, the third hollowed-out portion includes a fourth hole array, the fourth hole array includes a plurality of fourth holes arranged in an array, the fourth holes are strip-shaped holes, and a length extension direction of the fourth holes is the second direction.

Illustratively, a row direction of the fourth hole array is the second direction, and a column direction of the fourth hole array is the first direction; and each row of fourth holes is staggered with another row of fourth holes that is adjacent to the each row of fourth holes.

Illustratively, a line width of the second solid mesh line portion and a line width of the third solid mesh line portion are greater than a line width of the first solid mesh line portion.

Illustratively, the line width of a solid mesh line of the first solid mesh line portion is from 0.01 mm to 0.5 mm.

Illustratively, the solid mesh line of the first solid mesh line portion has a thickness of 0.05 mm to 0.5 mm in a direction perpendicular to the support body.

Illustratively, the support body is an integral structure made of a metallic material having a Young's modulus greater than a predetermined value.

Illustratively, the metallic material includes at least one of stainless steel, structural steel, titanium alloy, copper, copper alloy, aluminum alloy, or magnesium alloy.

An embodiment of the present disclosure further provides a display apparatus, including: a display device including a light-emitting surface and a back surface opposite to the light-emitting surface; and a support provided on the back surface of the display device, the support being the folding displayer support as described above.

The embodiments of present disclosure have the following beneficial effects:

According to the folding displayer support and display apparatus provided by the embodiments of the present disclosure, the support body of the folding displayer support is patterned to form the at least one first bending region, at least one second bending region and at least one bidirectional bending region. To endow the support body with different bending properties in different bending regions, the first bending region, the second bending region and the bidirectional bending region are designed to have different patterned mesh patterns, and the mesh patterns in different bending regions have different distribution and matching relationships, in which the first bending region is provided with the first mesh pattern to enable bending of the support body in the first direction; the second bending region is provided with the second mesh pattern to enable bending of the support body in the second direction; and the bidirectional bending region is located at a position where the first bending region overlaps the second bending region, and needs to be bendable in both cross directions of the first direction and the second direction at the same time. Therefore, the proportion of holes of the third mesh pattern of the bidirectional bending region is designed to be smaller than the proportion of holes of the first bending region and the proportion of holes of the second bending region, so as to increase the elastic modulus of the bidirectional bending region. The third mesh pattern is an axisymmetric pattern symmetrical about the bending axis of the first bending region and the bending axis of the second bending region. In this way, the third mesh pattern is able to be bent along the bending axis in the first direction and the bending axis in the second direction, so as to achieve folding in two bending directions and satisfy the functional requirements related to the bending flexibility.

DETAILED DESCRIPTION

In order to make the objective, technical solutions and advantages of the embodiments of the present disclosure clearer, the technical solutions of the embodiments of the present disclosure will be clearly and completely described by reference to the appended drawings of embodiments of the present disclosure. It is to be understood that the described embodiments are part, but not all, of the disclosed embodiments. Based on the embodiments described in the present disclosure, all other embodiments obtained by a person of ordinary skill in the art without creative effort shall fall within the protection scope of the present disclosure.

Unless defined otherwise, technical or scientific terms used in this disclosure shall have the ordinary meaning as understood by one of ordinary skill in the art to which this disclosure belongs. The terms "first", "second", and the like as used in this disclosure do not denote any order, quantity, or importance, but rather are used to distinguish one element from another. Likewise, terms such as "a", "an", or "the" do not denote a limitation of quantity, but rather denote the presence of at least one of a referenced item. Terms such as "comprising" or "comprises" means that the presence of an element or item preceding the word covers the presence of the element or item listed after the word and equivalents thereof, but does not exclude other elements or items. The terms "connecting" or "connected" and the like are not limited to physical or mechanical connections, but may include electrical connections, whether direct or indirect. The terms "upper", "lower", "left", "right" and the like are used only to indicate relative positional relationships that may change accordingly when an absolute position of an object being described changes.

In the related technologies, a flexible folding displayer is provided with a metal support on the back surface to improve the capability of the displayer such as the overall support capability, tensile capacity and impact resistance. However, metal supports are only designed for displayers with one-way bending. For displayers with two or more bending directions, due to different requirements for different bending regions of metal supports, no reasonable metal support has been designed, which affects the development of displayers with multiple bending directions.

Figure 1:
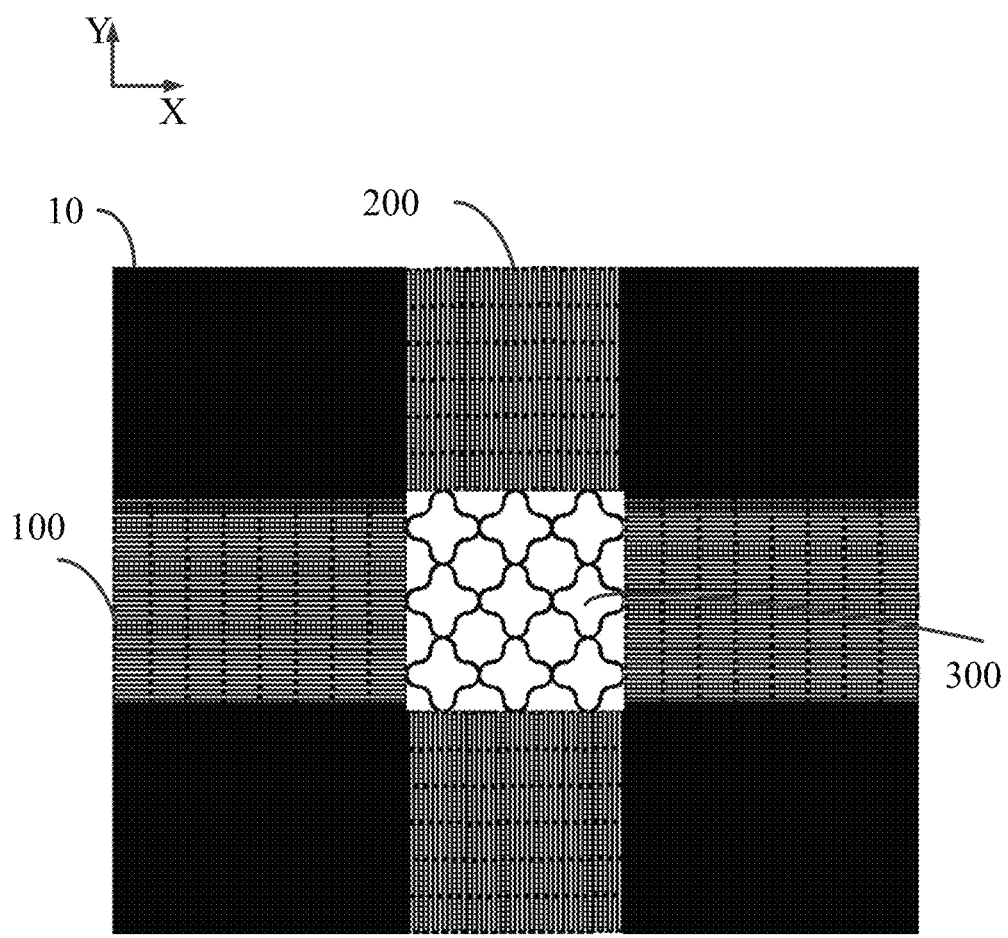
FIG. 1 is a schematic diagram showing an overall structure of a folding displayer support according to an embodiment of the present disclosure.
Figure 2:
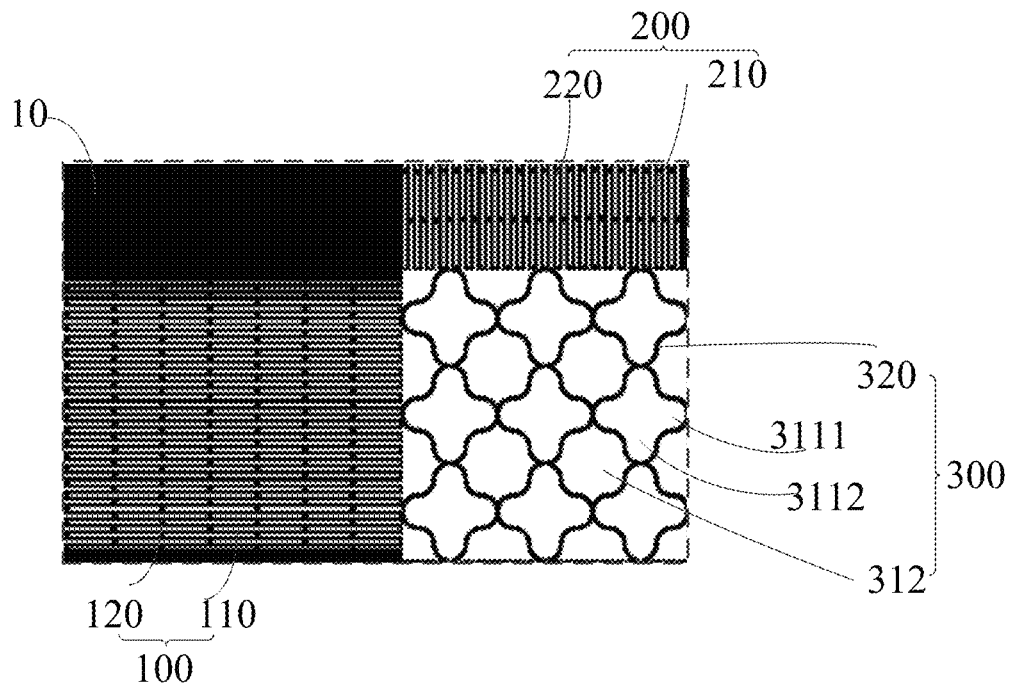
FIG. 2 is an enlarged view of a partial structure of a folding displayer support according to an embodiment of the present disclosure.

In order to solve the above-mentioned technical problem, an embodiment of the present disclosure provides a folding displayer support. As shown in FIG. 1 and FIG. 2, the folding displayer support includes a support body 10, and the support body 10 is provided with at least one first bending region 100, at least one second bending region 200 and at least one bidirectional bending region 300. The first bending region 100 extends in a first direction X to enable bending of the support body 10 in the first direction X; the second bending region 200 extends in a second direction Y to enable bending of the support body 10 in the second direction Y; the bidirectional bending region 300 is located at a position where the first bending region 100 intersects with the second bending region 200, and an included angle is formed between the first direction X and the second direction Y. The first bending region 100 is provided with a first mesh pattern, the second bending region 200 is provided with a second mesh pattern, and the bidirectional bending region 300 is provided with a third mesh pattern. A proportion of holes of the first mesh pattern and a proportion of holes of the second mesh pattern are both less than a proportion of holes of the third mesh pattern, and the proportion of holes is a percentage of area occupied by holes in a unit area; and a shape of each hole of the third mesh pattern is axisymmetric about a bending axis of the first bending region 100 and a bending axis of the second bending region 200.

According to the folding displayer support provided by the embodiments of the present disclosure, the support body 10 of the folding displayer support is patterned to form the at least one first bending region 100, at least one second bending region 200 and at least one bidirectional bending region 300. To endow the support body 10 with different bending properties in different bending regions, the first bending region 100, the second bending region 200 and the bidirectional bending region 300 are designed to have different patterned mesh patterns, and the mesh patterns in different bending regions have different distribution and matching relationships. The first bending region 100 is provided with the first mesh pattern to enable bending of the support body 10 in the first direction X; the second bending region 200 is provided with the second mesh pattern to enable bending of the support body 10 in the second direction Y; and the bidirectional bending region 300 is located at a position where the first bending region 100 overlaps the second bending region 200, and needs to be bendable in both cross directions of the first direction and the second direction at the same time. Therefore, the proportion of holes of the third mesh pattern of the bidirectional bending region 300 is designed to be larger than the proportion of holes of the first bending region 100 and the proportion of holes of the second bending region 200, so as to increase the elastic modulus of the bidirectional bending region 300. The third mesh pattern is an axisymmetric pattern symmetrical about the bending axis of the first bending region 100 and the bending axis of the second bending region 200. In this way, the third mesh pattern is able to be bent along the bending axis in the first direction X and the bending axis in the second direction Y, so as to achieve folding in two bending directions and satisfy the functional requirements related to bending flexibility.

It is to be noted that in the embodiments disclosed above, on the support body 10, the number of the first bending regions 100 may be one, two or more, where each of the first bending regions 100 refers to a first strip-shaped region extending in the first direction X from a first side edge of the support body 10 to a second side edge of the support body 10 opposite to the first side edge, the bidirectional bending region 300 is provided at an intersection position of the first strip-shaped region and the second bending region 200, and all the region of the first strip-shaped region except the bidirectional bending region 300 is one of the first bending regions 100. Similarly, the number of the second bending regions 200 may be one, two or more, where each of the second bending regions 200 refers to a second strip-shaped region extending in the second direction from a third side edge of the support body 10 to a fourth side edge of the support body 10 opposite to the third side edge, the bidirectional bending region 300 is provided at an intersection position of the second strip-shaped region and the second bending region 200, and a region of the second strip-shaped region other than the bidirectional bending region 300 is one of the second bending regions 200.

When the number of the first bending regions 100 is two or more, each of the first bending regions 100 may be arranged in parallel; and when the number of the second bending regions 200 is two or more, each of the second bending regions 200 may be arranged in parallel.

The folding displayer support provided by an embodiment of the present disclosure will be described by given an example that the support body 10 is provided with only one first bending region 100 and one second bending region 200.

Figure 3:
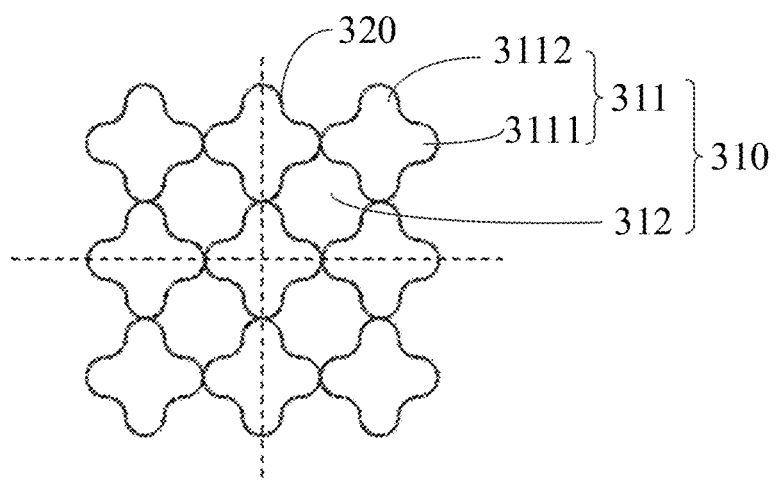
FIG. 3 is a schematic diagram of a bidirectional folding region of a folding displayer support according to an embodiment of the present disclosure.

In some exemplary embodiments, as shown in FIGS. 2 and 3, the third mesh pattern includes a first hollowed-out portion 310 and a first solid mesh line portion 320, the first hollowed-out portion 310 includes a first hole array, the first hole array includes a plurality of first holes 311 distributed in an array, the first hole 311 is a cross-shaped hole including a first strip-shaped hole 3111 and a second strip-shaped hole 3112 arranged in a cross shape, a length extension direction of the first strip-shaped hole 3111 is the first direction X, and a length extension direction of the second strip-shaped hole 3112 is the second direction Y.

In the above-described solution, the third mesh pattern of the bidirectional bending region 300 includes a plurality of first holes 311 distributed in an array, and the first holes 311 are cross-shaped, so that the bending function can be achieved based on the deformable property of the first holes 311. Taking the included angle α between the first direction X and the second direction Y as an example, the first strip-shaped hole 3111 and the second strip-shaped hole 3112 are arranged in a cross shape, which means that the first strip-shaped hole 3111 and the second strip-shaped hole 3112 cross at the included angle α to form a cross-shaped hole, namely, the included angle between the length extension direction of the first strip-shaped hole 3111 and the second strip-shaped hole 3112 of the first open hole 311 is equal to α; and the length extension direction of the first strip-shaped hole 3111 is the first direction X. The shape of the first strip-shaped hole 3111 is axisymmetric about the bending axis of the second bending region 200 and the bending axis of the first bending region 100, so that the bidirectional bending region 300 can achieve bending along the bending axis of the second bending region 200. The length extension direction of the second strip-shaped hole 3112 is the second direction Y, and the shape of the second strip-shaped hole 3112 is axisymmetric about the bending axis of the second bending region 200 and the bending axis of the first bending region 100, so that the bidirectional bending region 300 can achieve bending along the bending axis of the first bending region 100.

It is to be noted that in some embodiments of the present disclosure, in each of the first holes 311, a length of the first strip-shaped hole 3111 in the first direction X and a length of the second strip-shaped hole 3112 in the second direction Y may be the same or different. The length of the first strip-shaped hole 3111 in the first direction X depends on a factor such as a bending radius of the first bending region 100. The length of the second strip-shaped hole 3112 in the second direction Y depends on a factor such as a bending radius of the second bending region 200.

Specifically, a length A of the second strip-shaped hole 3112 in the second direction Y, a line width C of the first solid mesh line portion 320, and a bending radius R corresponding to an area where the second strip-shaped hole 3112 is located satisfy the following relationship (where the units of A, C and R are all taken as mm):

$$\frac{C^3}{R*A^3} \leq 10^{-4}.$$

Furthermore, it is to be noted that in the above-disclosed embodiments, the first hole 311 is a cross-shaped hole, and in other embodiments, the shape of the first hole 311 is not limited to this, so long as the first hole 311 has an axisymmetric pattern about the bending axis in the first direction X and the bending axis in the second direction Y. For example, the shape of the first hole 311 may be a circle, an ellipse, a diamond, a polygon, or the like.

Furthermore, in some exemplary embodiments of the present disclosure, as shown in the FIGS. 1 and 2, the first hollowed-out portion 310 also includes a second hole array, and the second hole array includes a plurality of second holes 312 distributed in an array. Each of the second holes 312 is enclosed by the first solid mesh line portion 320 in the middle of four adjacent first holes 311 distributed in the array.

In the above-mentioned solution, the third mesh pattern of the bidirectional bending region 300 is woven by the first solid mesh line portion 320, so that hollowed-out holes, namely, second holes 312, are formed in the middle of the first holes 311. As shown in FIGS. 1 and 2, the pattern of the second hole 312 is enclosed by the first solid mesh line portion 320 in the middle of the first holes 311, so that the second hole 312 provides enough space for the deformation of the first hole 311 when the bidirectional bending region 300 is bent, thereby further improving the deformability of the first hole 311 and achieving a bidirectional bending function. It is of course understood that in practice the third mesh pattern may not be provided with the second holes 312.

Furthermore, in some exemplary embodiments, two opposite ends of the first strip-shaped hole 3111 are in a circular arc shape or an elliptical arc shape, and two opposite ends of the second strip-shaped hole 3112 are in a circular arc shape or an elliptical arc shape; and the first solid mesh line portion 320, at an intersection corner of the first strip-shaped hole 3111 and the second strip-shaped hole 3112, is a transition curve in a circular arc shape or an elliptical arc shape.

With the above-mentioned solution, since the bidirectional bending region 300 achieves the bending by means of the deformation of the first open hole 311, in order to prevent the phenomenon of stress concentration when bending deformation occurs, ends of the first strip-shaped hole 3111 and the second strip-shaped hole 3112 are designed to be in a circular arc shape or an elliptical arc shape, and mesh lines at a corner of a region where the first strip-shaped hole 3111 intersects with the second strip-shaped hole 3112 are designed as a transition curve in a circular arc shape or an elliptical arc shape.

Figure 5:
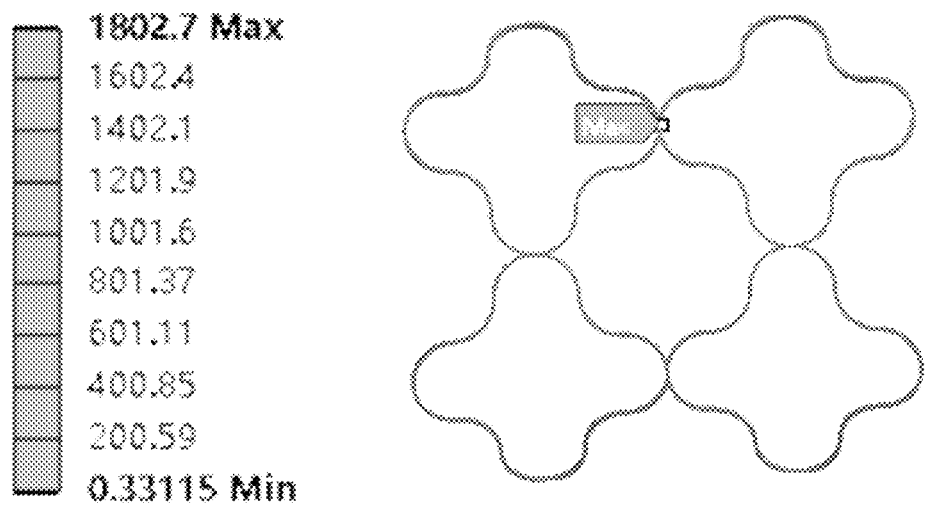
FIG. 5 is a distribution diagram of simulated stress of a folding displayer support according to an embodiment of the present disclosure.

Furthermore, FIG. 5 is a simulated stress distribution diagram of a folding displayer support provided by an embodiment of the present disclosure. According to the simulated stress distribution diagram, it can be seen that the ends of the first strip-shaped holes 3111 and the second strip-shaped holes 3112 and the mesh lines at the intersection position are subjected to a large stress. Therefore, if a straight line or a straight broken line is used at these positions, the stress will be concentrated and the mesh lines will be easily broken, so that designing these positions as a circular arc or an elliptical arc can help to reduce the stress concentration phenomenon, thereby improving the resistance to bending.

Figure 4:
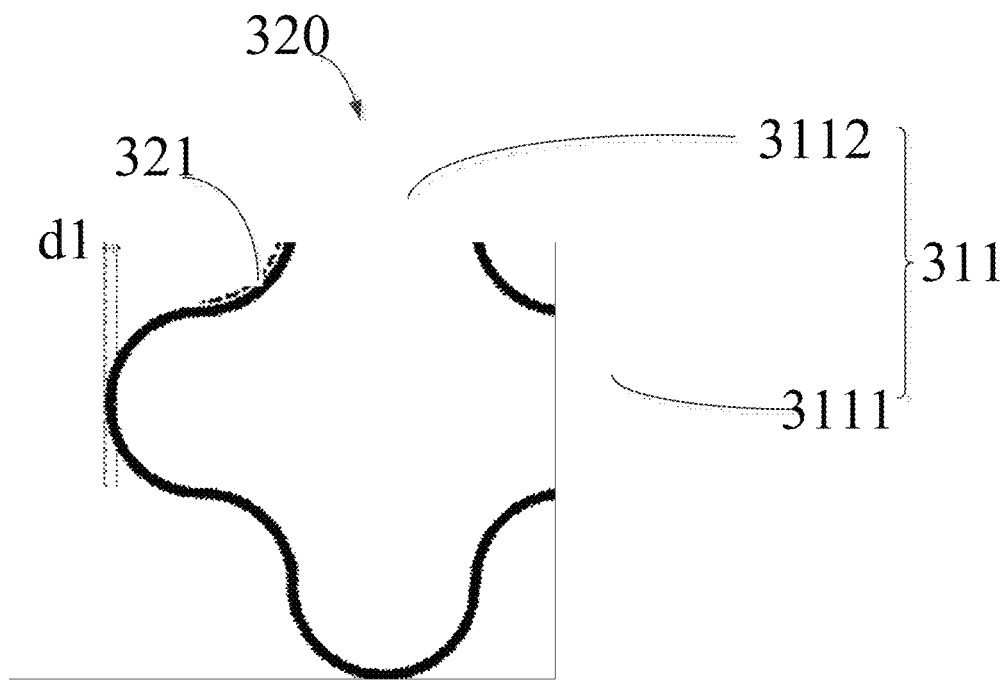
FIG. 4 is a schematic structural diagram of a first hole in a bidirectional folding region of a folding displayer support according to an embodiment of the present disclosure.

Furthermore, in some exemplary embodiments, as shown in FIG. 4, the first solid mesh line portion 320 at a corner of a region where the first strip-shaped hole 3111 intersects with the second strip-shaped hole 3112 includes at least one quarter circular arc or quarter elliptical arc 321.

In the above-mentioned solution, an example is given that the bending axis of the first bending region 100 is perpendicular to the bending axis of the second bending region 200, in the bidirectional bending region 300, each of the first holes 311 needs to be able to deform in a direction at an angle of 45° with respect to the first direction X at the position of the cross. Therefore, the corner is designed as a quarter circular arc or a quarter elliptical arc at the position of the cross, so as to ensure that no stress concentration occurs in the direction of the bending axis of the first bending region or the bending axis of the second bending region when the first holes 311 deform at the position of the cross.

Furthermore, a diameter of the quarter circular arc is greater than or equal to 0.2 mm, and a minor axis of the quarter elliptical arc is longer than or equal to 0.2 mm. In this way, by increasing the diameter of the quarter circular arc or the length of the minor axis of the quarter elliptical arc, the bending capacity of the region can be effectively increased, responding to a smaller bending radius requirement.

It should be understood that a shape of the mesh line at the intersection corner of the first strip-shaped hole 3111 and the second strip-shaped hole 3112 is not limited to this.

Furthermore, in some exemplary embodiments of the present disclosure, as shown in FIGS. 1 and 2, the first mesh pattern comprises: a second hollowed-out portion and a second solid mesh line portion 120, the second hollowed-out portion comprises a third hole array, the third hole array includes a plurality of third holes 110 arranged in an array, the third holes 110 are strip-shaped holes, and a length extension direction of the third holes 110 is the first direction; a row direction of the third hole array 110 is the first direction X, and a column direction is the second direction Y; and third holes 110 of each row are staggered with respect to third holes 110 of another row adjacent to the third holes 110 of the row.

In the above-mentioned solution, the mesh of the first bending region 100 is designed to arrange a plurality of rows of third holes 110 along the first direction X, and adjacent rows of third holes 110 are staggered, so that, in one aspect, a functional requirement that the first bending region 100 is bendable along the bending axis of the first direction X are satisfied, and in the other aspect, better bending resistance can be ensured.

In addition, both ends of the second strip-shaped hole 110 are in a circular arc shape or an elliptical arc shape, so as to prevent the stress concentration phenomenon.

It is to be noted that the specific structure of the first mesh pattern may not be limited to this.

In some exemplary embodiments of the present disclosure, the second mesh pattern includes: a third hollowed-out portion and a third solid mesh line portion 220, the third hollowed-out portion includes a fourth hole array, the fourth hole array includes a plurality of fourth holes 210 arranged in an array, the fourth hole 210 is a strip-shaped hole, and a length extension direction of the fourth holes 210 is the second direction Y; a row direction of the fourth hole 210 array is the second direction Y, and a column direction is the first direction X; and fourth holes 210 of each row are staggered with respect to fourth holes 210 of another row adjacent to the fourth holes 210 of the row.

In the above-mentioned solution, the mesh of the second bending region 200 is designed to arrange a plurality of rows of fourth holes 210 along the second direction Y, and adjacent rows of fourth holes 210 are staggered, so that, in one aspect, the functional requirements of bending along the bending axis of the second bending region 200 in the second direction Y are satisfied, and in the other aspect, better bending resistance can be ensured.

In addition, both ends of the fourth hole 210 are in a circular arc shape or an elliptical arc shape, so as to prevent the stress concentration phenomenon.

It is to be noted that the specific structure of the second mesh pattern may not be limited to this.

Further more, in some exemplary embodiments of the present disclosure, a line width of the second solid mesh line portion 120 and a line width of the third solid mesh line portion 220 are both larger than the line width dl of the first solid mesh line portion 320, so that the Young's modulus of the bidirectional bending region 300 is smaller than the Young's modulus of the first bending region 100 and the Young's modulus of the second bending region 200, further optimizing the bending capability of the bidirectional bending region 300, responding to the design requirement of a smaller bending radius.

Furthermore, a line width of a solid mesh line portion of the first solid mesh line portion 320 is from 0.01 mm to 0.5 mm.

Furthermore, in some exemplary embodiments of the present disclosure, a solid mesh line of the first solid mesh line portion 320 has a thickness of 0.05 mm to 0.5 mm in a direction perpendicular to the support body 10. The thickness is designed to achieve a balance between planar support capability and bending flexibility of the folding displayer support. If the thickness is less than 0.05 mm, the planar support capability of the folding displayer support is insufficient, and the mechanical performance of a screen is insufficient; if the thickness is more than 0.5 mm, it is difficult for the folding displayer support to achieve bending flexibility.

Furthermore, in some exemplary embodiments of the present disclosure, the support body 10 is an integral structure made of a metallic material having a Young's modulus greater than a predetermined value. The predetermined value may be defined according to the requirements on bending performance in practical applications. For example, the support body 10 may be selected from a high Young's modulus metal material having a Young's modulus higher than a predetermined value, such as stainless steel, structural steel, and titanium alloy; metallic materials having a relatively low Young's modulus may also be selected, such as copper and copper alloys, aluminum alloys, and magnesium alloys.

Furthermore, as shown in the figures, any other region of the support body 10 than the first bending region 100, the second bending region 200 and the bi-directional bending region 300 may be a planar area.

The folding displayer support provided by the embodiments of the present disclosure is suitable for use in a flexible display apparatus, such as a flexible OLED display device. For example, a display device includes a light-emitting surface and a back surface opposite to the light-emitting surface, and the folding displayer support is provided on the back surface of the display device, for example, the display device and the folding displayer support may be assembled with an adhesive layer. Taking an example that the display device is an OLED display device, the OLED display device may be a top-emission structure, and in an embodiment of the present disclosure, a folding displayer support is arranged on a back side of the display device. It will of course be appreciated that the folding displayer support may be applied not only to OLED display devices.

Further, an embodiment of the present disclosure provides a display apparatus, including a display device 20, which includes a light-emitting surface 21, a back surface 22 opposite to the light-emitting surface 21, and a support provided on the back side of the display device. The support adopts the folding displayer support in the embodiments of the present disclosure.

The display device may be a liquid crystal television, a liquid crystal display, a digital photo frame, a mobile phone, a tablet computer, or any product or component with a display function, in which the display device further includes a flexible circuit board, a printed circuit board and a back plate.

It will be apparent that the display device provided according to the embodiments of the present disclosure has the benefits brought by the folding displayer support provided by the embodiments of the present disclosure, which are not be described in detail herein.

The following points need to be explained.

(1) The drawings relate only to structures to which the embodiments of the present disclosure relate, and other structures may refer to common designs.

(2) In the drawings used to describe embodiments of the present disclosure, the thickness of a layer or a region is zoomed in or out for clarity, that is to say, the drawings are not drawn in the actual scale. It will be understood that when an element such as a layer, film, region or substrate is referred to as being "on" or "under" another element, it can be "directly on" or "directly under" the other element, or intervening elements may be present.

(3) In case of no conflict, embodiments of the present disclosure and features of the embodiments can be combined with each other to form a new embodiment.

The foregoing embodiments are directed to particular implementations of the present disclosure, but the protection scope of the present disclosure is not limited thereto. The protection scope of the disclosure is subject to the appended claims.

What is claimed is:

1. A folding displayer support, comprising a support body, wherein the support body is provided with at least one first bending region extending in a first direction, at least one second bending region extending in a second direction, and at least one bidirectional bending region located at a position where the first bending region intersects with the second bending region, and an included angle is formed between the first direction and the second direction;

the first bending region is provided with a first mesh pattern, the second bending region is provided with a second mesh pattern, the bidirectional bending region is provided with a third mesh pattern, a proportion of holes of the first mesh pattern and a proportion of holes of the second mesh pattern are less than a proportion of holes of the third mesh pattern, and the proportion of holes is a percentage of an area occupied by holes in a unit area; and a shape of one of the holes of the third mesh pattern is axisymmetric about a bending axis of the first bending region and a bending axis of the second bending region;

wherein the third mesh pattern comprises a first hollowed-out portion and a first solid mesh line portion, the first hollowed-out portion comprises a first hole array, the first hole array comprises a plurality of first holes distributed in an array, each of the first holes is a cross-shaped hole comprising a first strip-shaped hole and a second strip-shaped hole arranged in a cross shape, a length extension direction of the first strip-shaped hole is the first direction, and a length extension direction of the second strip-shaped hole is the second direction;

wherein the first hollowed-out portion further comprises a second hole array, the second hole array comprises a plurality of second holes distributed in an array, and each of the second holes is surrounded by the first solid mesh line portion in the middle of four adjacent first holes distributed in the array;

wherein the first mesh pattern comprises a second hollowed-out portion and a second solid mesh line portion, the second hollowed-out portion comprises a third hole array, the third hole array comprises a plurality of third holes distributed in an array, the third holes are strip-shaped holes, and a length extension direction of the third holes is the first direction;

wherein the second mesh pattern comprises a third hollowed-out portion and a third solid mesh line portion, the third hollowed-out portion comprises a fourth hole array, the fourth hole array comprises a plurality of fourth holes arranged in an array, the fourth holes are strip-shaped holes, and a length extension direction of the fourth holes is the second direction;

wherein a line width of the second solid mesh line portion and a line width of the third solid mesh line portion are greater than a line width of the first solid mesh line portion.

2. The folding displayer support according to claim 1, wherein two opposite ends of the first strip-shaped hole are in a circular arc shape or an elliptical arc shape, and/or two opposite ends of the second strip-shaped hole are in a circular arc shape or an elliptical arc shape; and the first solid mesh line portion at a corner of a region where the first strip-shaped hole intersects with the second strip-shaped hole is a transition curve in a circular arc shape or an elliptical arc shape.

3. The folding displayer support according to claim 2, wherein the first solid mesh line portion at the corner of the region where the first strip-shaped hole intersects with the second strip-shaped hole comprises at least one quarter circular arc or quarter elliptical arc, a diameter of the quarter circular arc is greater than or equal to 0.2 mm, and a minor axis of the quarter elliptical arc is longer than or equal to 0.2 mm.

4. The folding displayer support according to claim 1, wherein a row direction of the third hole array is the first direction, and a column direction of the third hole array is the second direction; and each row of third holes is staggered with another row of third holes that is adjacent to the each row of third holes.

5. The folding displayer support according to claim 1, wherein a row direction of the fourth hole array is the second direction, and a column direction of the fourth hole array is the first direction; and each row of fourth holes is staggered with another row of fourth holes that is adjacent to the each row of fourth holes.

6. The folding displayer support according to claim 1, wherein the line width of a solid mesh line of the first solid mesh line portion is from 0.01 mm to 0.5 mm.

7. The folding displayer support according to claim 1, wherein the solid mesh line of the first solid mesh line portion has a thickness of 0.05 mm to 0.5 mm in a direction perpendicular to the support body.

8. The folding displayer support according to claim 1, wherein the support body is an integral structure made of a metallic material having a Young's modulus greater than a predetermined value.

9. The folding displayer support according to claim 8, wherein the metallic material comprises at least one of stainless steel, structural steel, titanium alloy, copper, copper alloy, aluminum alloy, or magnesium alloy.

10. A display apparatus, comprising:

a display device comprising a light-emitting surface and a back surface opposite to the light-emitting surface; and a support provided on the back surface of the display device, the support being the folding displayer support according to claim 1.

* * * * *